(12) United States Patent
Kopiness et al.

(10) Patent No.: US 8,816,625 B2
(45) Date of Patent: Aug. 26, 2014

(54) INTEGRATED REGENERATIVE AC DRIVE WITH SOLID STATE PRECHARGING

(75) Inventors: Jeremiah Kopiness, Saukville, WI (US);
Raymond G. Sladky, Grafton, WI (US);
Ahmed Mohamed sayed ahmed,
Mequon, WI (US)

(73) Assignee: Rockwell Automation Technologies, Inc., Mayfield Hts., OH (US)

( * ) Notice: Subject to any disclaimer, the term of this patent is extended or adjusted under 35 U.S.C. 154(b) by 393 days.

(21) Appl. No.: 13/282,898

(22) Filed: Oct. 27, 2011

(65) Prior Publication Data
US 2013/0106328 A1 May 2, 2013

(51) Int. Cl.
*H02P 1/16* (2006.01)
*H02M 1/36* (2007.01)
*H02P 3/14* (2006.01)

(52) U.S. Cl.
USPC .............................. 318/430; 318/376; 363/49

(58) Field of Classification Search
CPC ... H02P 1/26; H02P 2201/01; H02P 23/0095; H02P 6/08; B60L 3/0046; H01M 8/04567; H02M 1/36
USPC .................... 318/400.11, 273, 376, 430, 431; 363/34, 35, 37, 39, 44, 45–49
See application file for complete search history.

(56) References Cited

U.S. PATENT DOCUMENTS

| | | | |
|---|---|---|---|
| 3,757,197 A | 9/1973 | Bailey | |
| 4,039,914 A | 8/1977 | Steigerwald et al. | |
| 4,215,304 A | 7/1980 | D'Atre et al. | |
| 4,230,979 A | 10/1980 | Espelage et al. | |
| 4,276,589 A | 6/1981 | Okawa et al. | |
| 4,319,177 A * | 3/1982 | Kawada et al. | 318/798 |
| 4,496,899 A | 1/1985 | Lippitt et al. | |
| 4,545,002 A | 10/1985 | Walker | |
| 4,833,389 A | 5/1989 | Kovalsky | |
| 4,864,483 A * | 9/1989 | Divan | 363/37 |
| 4,870,338 A | 9/1989 | Abbondanti | |
| 5,005,115 A | 4/1991 | Schauder | |
| 5,041,959 A | 8/1991 | Walker | |
| 5,083,039 A | 1/1992 | Richardson et al. | |
| 5,715,154 A | 2/1998 | Rault | |
| 5,798,632 A | 8/1998 | Muljadi | |
| 6,157,097 A | 12/2000 | Hirose et al. | |
| 6,166,929 A | 12/2000 | Ma et al. | |
| 6,275,393 B1 * | 8/2001 | Baudelot et al. | 363/37 |
| 6,445,165 B1 | 9/2002 | Malik et al. | |
| 6,646,842 B2 | 11/2003 | Pan et al. | |
| 6,735,098 B2 * | 5/2004 | Hussein et al. | 363/56.03 |
| 6,828,742 B2 * | 12/2004 | Suzuki et al. | 318/139 |

(Continued)

FOREIGN PATENT DOCUMENTS

EP 1091478 A2 4/2001

OTHER PUBLICATIONS

EP Search Report, Application No. 12190456.9-1804, mailed Mar. 1, 2013, completed Feb. 19, 2013, Munich.

*Primary Examiner* — Bentsu Ro
(74) *Attorney, Agent, or Firm* — Fay Sharpe LLP

(57) ABSTRACT

Integrated AC regenerative motor drives and operating methods are presented in which a precharging circuit is provided with an IGBT, a diode and a parallel current limiting component in an intermediate DC circuit between a switching rectifier and an output inverter, and the drive is operated in one of three modes for motoring, regenerating and precharging.

21 Claims, 4 Drawing Sheets

(56) References Cited

U.S. PATENT DOCUMENTS

| | | |
|---|---|---|
| 7,233,465 B2 | 6/2007 | Lee |
| 7,312,537 B1 | 12/2007 | Walling et al. |
| 7,432,686 B2 | 10/2008 | Erdman et al. |
| 7,462,946 B2 | 12/2008 | Wobben |
| 7,505,291 B2 | 3/2009 | Wang et al. |
| 7,511,385 B2 | 3/2009 | Jones et al. |
| 7,595,563 B2 | 9/2009 | Wobben |
| 7,656,052 B2 | 2/2010 | Jones et al. |
| 7,663,260 B2 | 2/2010 | Kabatzke et al. |
| 7,679,208 B1 | 3/2010 | Ko et al. |
| 7,692,321 B2 | 4/2010 | Jones et al. |
| 7,692,325 B2 | 4/2010 | Ichinose et al. |
| 7,746,020 B2 * | 6/2010 | Schnetzka et al. ............ 318/632 |
| 7,755,209 B2 | 7/2010 | Jones et al. |
| 7,816,798 B2 | 10/2010 | Hehenberger |
| 7,929,323 B2 | 4/2011 | Schmidt |
| 8,030,791 B2 | 10/2011 | Lang et al. |
| 2002/0191426 A1 | 12/2002 | Hussein et al. |
| 2003/0035311 A1 | 2/2003 | Phadke |
| 2003/0063481 A1 | 4/2003 | Kojori |
| 2006/0232250 A1 | 10/2006 | Sihler et al. |
| 2008/0074812 A1 | 3/2008 | Oestreich et al. |
| 2010/0080022 A1 | 4/2010 | Schmidt |
| 2011/0038185 A1 | 2/2011 | Swamy et al. |
| 2011/0057444 A1 | 3/2011 | Dai et al. |
| 2011/0057588 A1 | 3/2011 | Rineh et al. |

* cited by examiner

REGENERATING

MOTORING

INTEGRATED REGENERATIVE AC DRIVE WITH SOLID STATE PRECHARGING

BACKGROUND

The present disclosure relates generally to integrated motor drive systems and more particularly to integrated regenerative AC drives with solid-state precharging circuitry. Integrated AC motor drives provide a single package product for powering AC electrical motors using converted power from an AC input source. Regenerative drives are operable in a motoring mode in which power is converted from the AC input source for driving a motor load, as well as a regenerating mode in which power from the motor drive is provided to the AC source. Voltage source converter type AC drives include a DC circuit with one or more capacitors providing a DC bus voltage from which an output inverter derives power for driving a motor load. During startup, the initial charging of the DC bus capacitance can result in excessive inrush current which can damage or degrade motor drive components and associated protective equipment.

Conventional integrated regenerative AC motor drives have accordingly provided an AC contactor or relays situated between the AC power source terminals and an input rectifier, where one or more AC input lines include contact terminals connected in parallel with a current limiting device to limit inrush current during power application. At power up, the relay or contactor is maintained in an "off" state with the contacts "open" such that the incoming AC currents flow through the current limiting devices to thereby limit the inrush current. Once the DC link capacitance has been properly precharged, the contactor or relay is activated to close the contacts, thereby bypassing the current limiting devices for normal operation.

Contactors and relays, however, are costly and occupy valuable space in an integrated motor drive. Moreover, power for energizing a relay or contactor coil must be derived from the input power, and this control power must be available even if multiphase AC input power wiring errors occur and/or phase loss problems arise. In addition, contactors and relays are subject to wear and degradation, and I/O and wiring requirements must be accommodated in the limited space of modern integrated motor drives. Thus, there remains a need for improved inrush current limiting designs allowing controlled charging of DC bus capacitors for integrated regenerative motor drives.

SUMMARY

Various aspects of the present disclosure are now summarized to facilitate a basic understanding of the disclosure, wherein this summary is not an extensive overview of the disclosure, and is intended neither to identify certain elements of the disclosure, nor to delineate the scope thereof. Rather, the primary purpose of this summary is to present some concepts of the disclosure in a simplified form prior to the detailed description that is presented hereinafter.

The present disclosure involves integrated regenerative motor drives and precharging circuitry thereof with which high inrush currents can be avoided or mitigated during startup of the drive while a DC bus capacitance is charged. A solid-state precharging circuit is provided in the DC link circuit between the link capacitance and the switching rectifier front end, and includes one or more integrated gate bipolar transistor (IGBT) switching devices connected in parallel with a current-limiting resistance and a freewheeling diode, where the diode and the IGBT may be integrated within a single package, and more than one such composite switching devices may be provided in the precharging circuitry. This approach can be advantageously employed within an integrated motor drive in which an active front end rectifier and switching inverter are housed in a common enclosure with the DC link circuitry and the precharging circuit, where the solid-state precharging circuitry is much smaller than conventional AC current limiting systems using contactors and/or relays, and is less susceptible to degradation and wear. In addition, the present disclosure advantageously provides the precharging circuitry within the DC intermediate circuit and thus requires only a single current-limiting resistance, and is significantly less expensive than contactor/relay approaches.

In accordance with one or more aspects of the present disclosure, an integrated AC regenerative motor drive is provided which includes input and output terminals for coupling to an AC input source and an AC motor, respectively, as well as an enclosure that defines an interior in which the drive components are located. A switching rectifier, an intermediate DC circuit, a precharging circuit, an inverter, and a controller are provided within the interior of the enclosure to constitute an integrated drive. The drive in certain embodiments may further include a three-phase reactor housed within the interior of the enclosure. The precharging circuit includes a resistor or other current limiting component, a diode, and at least one IGBT precharge switching device disposed in the intermediate DC circuit. The drive also includes a controller that provides switching control signals to the switching rectifier, the precharging circuit and the inverter in order to precharge the intermediate DC circuit capacitance through the precharging circuit current limiting component in a first mode, to conduct regenerative current from the intermediate DC circuit through a diode of the precharging circuit in a second mode, and to conduct DC current through the IGBT and convert DC power from the intermediate DC circuit to provide AC electrical power to an AC motor load in a third mode.

In certain embodiments, the intermediate DC circuit provides first and second DC current paths, where the first current path includes a first conductor portion coupled with a first DC output node of the rectifier as well as a separate second conductor portion coupled with a first DC input node of the inverter. The precharge circuit IGBT includes power terminals coupled respectively with the first and second conductor portions of the intermediate DC circuit, and the diode has a cathode coupled with the first conductor portion and an anode coupled with the second conductor portion for conduction of regenerative currents. In addition, the precharging circuit current limiting component is coupled between the first and second conductor portions of the intermediate DC circuit. In the first (precharging) mode, the controller provides the control signals to turn off the switching devices of the rectifier, the precharging circuit and the inverter so as to precharge intermediate DC circuit capacitance through the switching rectifier and the current limiting component. In the second (regenerating) mode, the controller provides the control signals to cause the rectifier to conduct regenerative current from the intermediate DC circuit to the input terminals through the precharging circuit diode. In the third mode (motoring) the controller provides the control signals to turn the precharge switching device on and to operate the rectifier and inverter to drive the motor load.

In certain embodiments, the precharging circuit includes a plurality of diodes and IGBT switching devices coupled in parallel with the current limiting component. In certain embodiments, moreover, the controller provides the rectifier switching control signals in the second (regenerating) mode at a frequency approximately equal to the fundamental AC input frequency (e.g., fundamental front end or FFE operation). In other embodiments, the controller provides the rectifier switching control signals in the second mode using pulse width modulation (PWM) at a frequency at least one order of magnitude greater than the AC input fundamental frequency for active front end (AFE) operation. The motor drive in certain embodiments further includes an input filter with reactors individually coupled in series between one of the AC input terminals and a corresponding one of the rectifier AC nodes. In certain embodiments, the input filter provides a plurality of L-C-L filter circuits, individually including first and second reactors coupled in series between the corresponding input terminal and rectifier AC node along with a filter capacitance coupled between a node joining the first and second reactors in a common terminal.

In accordance with further aspects of the disclosure, a method is provided for operating an AC regenerative motor drive. The method includes providing a precharge circuit in an intermediate DC circuit between a rectifier and an inverter of an integrated regenerative motor drive. In addition, the method includes precharging at least one capacitance of the intermediate DC circuit through a current limiting component of the precharge circuit in a first mode (precharging), as well as conducting regenerative current from the intermediate DC circuit through a precharging circuit diode in a second mode (regenerating), and conducting DC current through an IGBT of the precharging circuit and converting DC power from the intermediate DC circuit to provide AC electrical power to an AC motor load in a third (motoring) mode. In certain embodiments, the capacitance precharging involves providing control signals to turn off the switches of the rectifier, the precharging circuit and the inverter. In certain embodiments, moreover, the regenerative current conduction includes providing control signals to cause the rectifier to conduct regenerative current from the intermediate DC circuit through the precharging circuit diode to an AC source. In certain embodiments, conducting DC current through the IGBT in the third mode includes providing control signals to turn on the precharging circuit switching device and to cause the rectifier to convert input power to provide DC power to the intermediate circuit and to cause the inverter to selectively convert DC power from the intermediate DC circuit to provide AC electrical power to the motor load.

In accordance with further aspects of the disclosure, a computer-readable medium is provided having a computer-executable instructions for operating an AC regenerative motor drive having a precharge circuit in an intermediate DC circuit between a rectifier and an inverter. The computer-readable medium comprises computer-executable instructions for precharging an intermediate DC circuit capacitance through a precharge circuit current limiting component in a first mode (precharging), as well as conducting regenerative current from the intermediate DC circuit through a precharging circuit diode in a second mode (regenerating), and conducting DC current through an IGBT of the precharging circuit and converting DC power from the intermediate DC circuit to provide AC electrical power to an AC motor load in a third (motoring) mode.

In accordance with further aspects of the disclosure, a power conversion system is provided, which includes an enclosure, a switching rectifier, and a DC circuit with at least one capacitance. First and second DC output terminals are coupled with the DC circuit, and a precharging circuit is provided with a current limiting component, a diode and one or more IGBT precharge switching devices disposed in the DC circuit. The system further includes a controller operative to provide switching control signals to the switching rectifier and to the precharging circuit in a first mode to precharge the DC circuit capacitance through the current limiting component of the precharging circuit. In a second mode, the controller provides the switching control signals to conduct regenerative current from the DC circuit through the precharging circuit diode, and in a third mode the controller provides the signals to conduct DC current through the IGBT of the precharging circuit and to provide DC power from the DC circuit to the DC output terminals.

BRIEF DESCRIPTION OF THE DRAWINGS

The following description and drawings set forth certain illustrative implementations of the disclosure in detail, which are indicative of several exemplary ways in which the various principles of the disclosure may be carried out. The illustrated examples, however, are not exhaustive of the many possible embodiments of the disclosure. Other objects, advantages and novel features of the disclosure will be set forth in the following detailed description when considered in conjunction with the drawings, in which.

DETAILED DESCRIPTION

Figure 1:
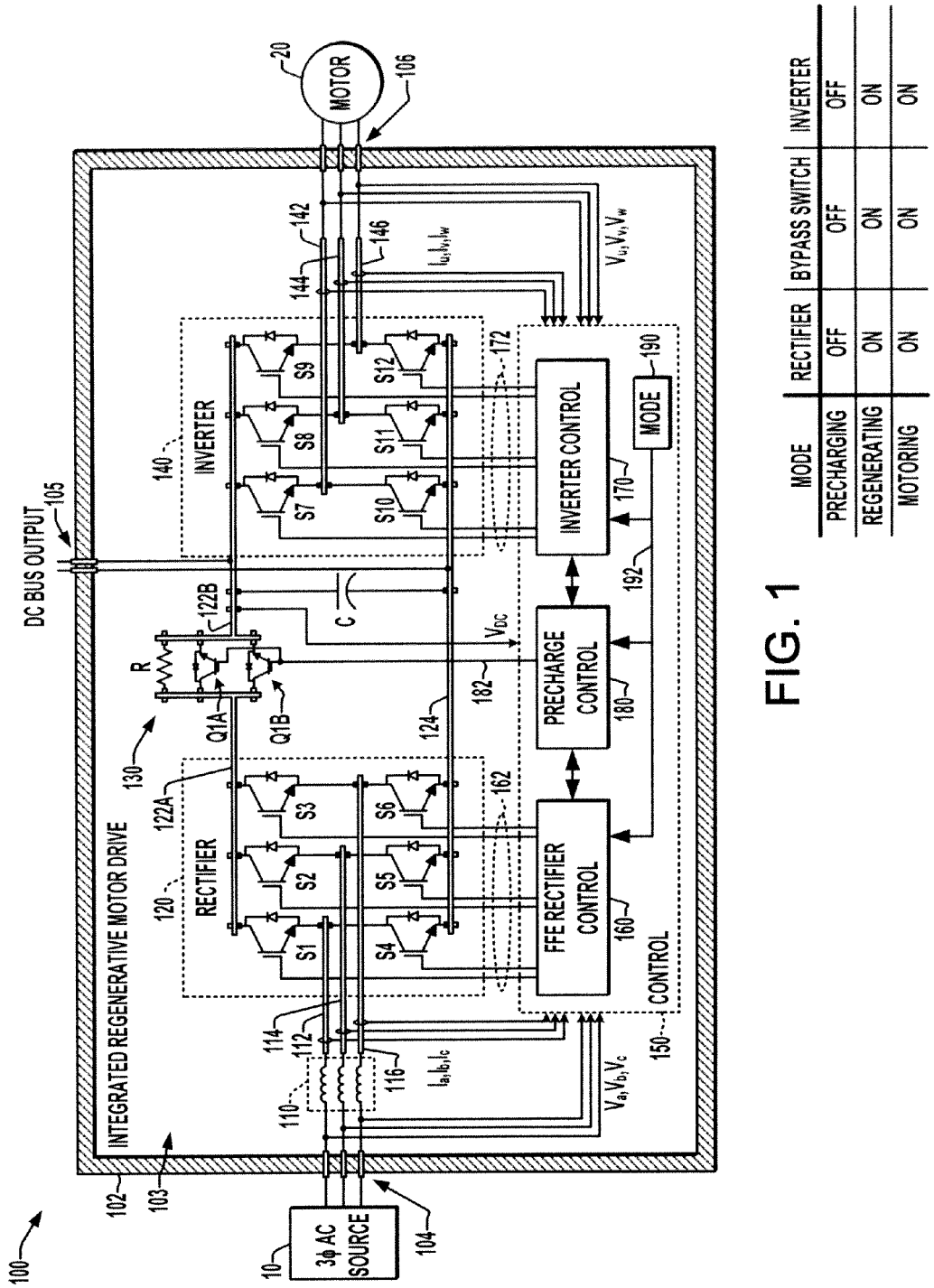
FIG. 1 is a schematic diagram illustrating an exemplary integrated regenerative motor drive with a fundamental front end (FFE) switching rectifier and IGBT-based precharging circuitry in accordance with one or more aspects of the present disclosure.

Referring now to the figures, several embodiments or implementations of the present disclosure are hereinafter described in conjunction with the drawings, wherein like reference numerals are used to refer to like elements throughout, and wherein the various features are not necessarily drawn to scale. Multi-phase integrated AC regenerative motor drives 100 are hereinafter illustrated and described which include novel precharging circuitry disposed in an intermediate DC link circuit for controlling inrush current during precharging of a link capacitance. It will be appreciated that the illustrated embodiments are merely examples, and that the disclosed precharging apparatus and methods can be used in integrated regenerative drives that utilize single or multi-phase AC input power and/or those that provide single or multi-phase output power to drive an AC motor. In this regard, non-regenerative motor drive, and bus supply embodiments are contemplated, wherein the illustrated embodiments are merely examples.

Figure 2:
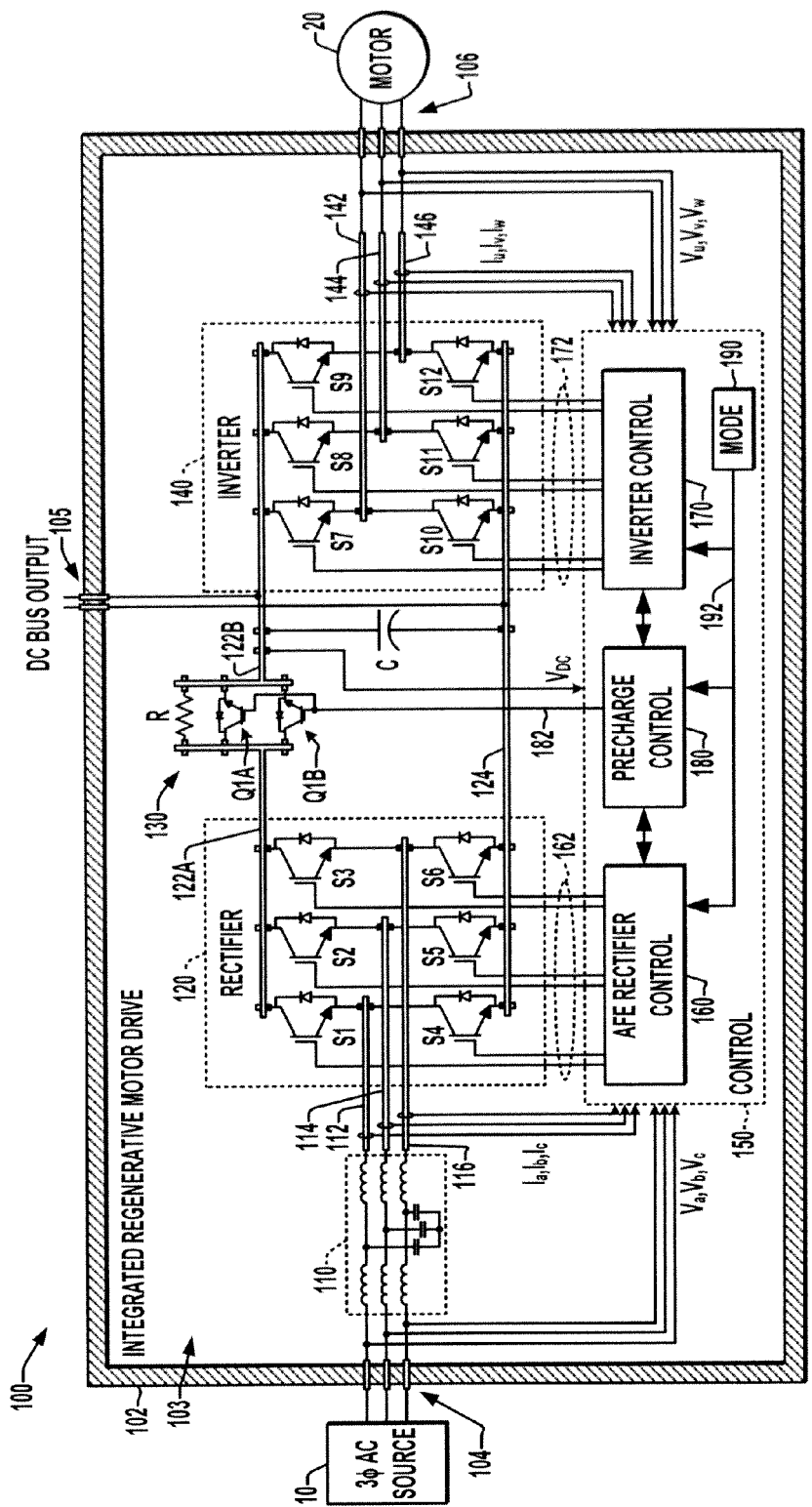
FIG. 2 is a schematic diagram illustrating an exemplary integrated regenerative motor drive with an active front end (AFE) switching rectifier and an IGBT-based precharging circuit according to the present disclosure.
Figure 3:
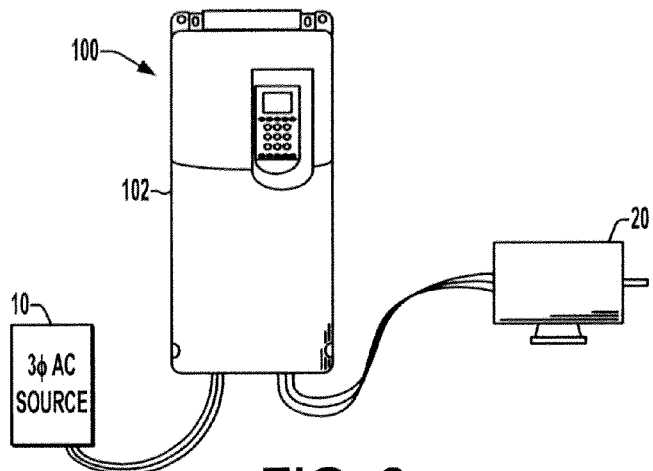
FIG. 3 is a front elevation view illustrating an exemplary wall-mount integrated regenerative motor drive of FIGS. 1 and 2 coupled with a three-phase AC power source and a three-phase AC motor load in accordance with the present disclosure.

Referring initially to FIGS. 1-3, FIGS. 1 and 2 illustrate first and second embodiments of an integrated AC regenerative motor drive 100. In both examples, the drive 100 includes an input rectifier (converter) 120, an intermediate DC link circuit with a link capacitance C, an inverter 140, a precharging circuit 130 with one or more IGBTs Q1 (two IGBTs Q1A and Q1B shown in the drawings) and a controller 150 housed within the interior 103 of a single enclosure 102. As exemplified in FIG. 3, the enclosure 102 in one example is a structure preventing user exposure to the internal subsystems and components thereof and providing input terminals 104 for coupling to an AC input source 10 as well as output terminals 106 for connection to a driven AC motor 20. In certain embodiments, first and second DC output terminals 105 are provided to allow external access to the DC bus of the intermediate circuit, for instance, to power an external inverter or other circuit requiring DC input power. In certain embodiments, moreover, the inverter 140 and the corresponding inverter control component 170 may be omitted, whereby a power conversion system 100 is provided including the housing 102, an input rectifier 120, a DC circuit having a capacitance C, and the precharging circuit 130 including one or more IGBTs Q1 and a controller 150 housed within the interior 130 of the enclosure 102, with the DC output terminals 105 providing DC output power from the DC circuit as a common bus supply product 100.

The embodiment in FIG. 1 includes an input filter circuit 110 including line reactors connected in series in each of three AC input lines between the three-phase AC source 10 and AC input nodes 112, 114 and 116 of the switching rectifier 120. This embodiment, moreover, employs a fundamental front end (FFE) rectifier switching control component 160 of the controller 150 providing rectifier switching control signals 162 in a regenerating mode of operation at a frequency approximately equal to the fundamental AC input source frequency (e.g., 50 Hz or 60 Hz typically).

The example of FIG. 2 employs an L-C-L multi-phase input filter circuit 110 including L-C-L filters with first and second reactors (inductors) coupled in series between the corresponding input terminal 104 and the corresponding rectifier AC node 112, 114, 116. These filter circuits 110 further include a filter capacitance coupled from the node joining the first and second reactors to a common terminal, which may be grounded, ungrounded or connected to other suitable electrical common circuit potential within the motor drive 100. The embodiment of FIG. 2, moreover, employs an active front end (AFE) rectifier control 160 that employs pulse width modulated (PWM) rectifier switching control signals 162 for regenerating operation at a PWM frequency of at least one order of magnitude greater than the AC input source fundamental frequency, such as about 4 kHz in one example.

As seen in FIG. 1, the switching rectifier 120 includes AC input nodes 112, 114 and 116 coupled with the input terminals 104 for receiving AC power from the source 10, and provides DC output power to the intermediate DC circuit at nodes 122A (+) and 124 (−). The illustrated rectifier 120 is a three-phase input, DC output, converter stage including rectifier switching devices S1-S6 operative according to switching control signals 162 from the controller 150. In the illustrated examples, the rectifier switching devices S1-S6 are IGBTs each having an associated freewheeling diode, but other forms of electrical switching devices can be used. The DC output nodes of the rectifier 120 are coupled with the intermediate DC circuit which includes the precharging circuit 130 disposed in the upper (e.g., positive) current path of the DC link circuit, as well as a DC link capacitance C coupled between the upper and lower DC current paths of the link circuit, with the precharging circuit 130 located between the upper terminal of the link capacitance C and the positive output of the rectifier 120.

The inverter 140 in certain embodiments receives DC power from the intermediate DC circuit and provides three-phase AC electrical power to drive the motor load 20 by DC-AC conversion using inverter switching devices S7-S12, which can be any suitable form of electronically actuatable switching devices, such as IGBTs in the illustrated embodiments. In other possible implementations, the inverter 140 and associated inverter control component 170 can be omitted, and the power conversion system 100 (e.g., a, and bus supply product) may include DC bus output terminals 105 electrically coupled with the positive and negative DC bus terminals of the intermediate circuit in order to provide DC output power flow to or from an external device (not shown). In some embodiments, moreover, the inverter 140 and associated controller 170 may be included within the drive system 100, and the drive 100 may provide the DC output terminals 105 for selectively providing DC output power to, or receiving power from, an external device. The active rectifier 120 is operated by rectifier switching control signals 162 from the rectifier controller 160, and the inverter 140 is operated by inverter switching control signals 182 from the inverter controller component 170 of the controller 150. Other forms of rectifier and/or inverter switching devices S1-S12 can be used having appropriate control terminals operated according to the switching control signals 162, 182 (e.g., semiconductor-based switches such as silicon controlled rectifiers (SCRs), gate turn-off thyristors (GTOs), gate commutated thyristors (GCTs) such as integrated gate commutated thyristors (IGCTs) or symmetrical gate commutated thyristors (SGCTs)), etc.).

The controller 150 includes a rectifier controller 160, an inverter controller 170 (omitted in certain embodiments) and a precharge controller 180 operable according to a current operational mode 190, where the operational mode of the motor drive 100 can be set by an external mode selection signal or value (not shown) from a user or from another system, and/or the mode 190 can be set based on internal conditions within the drive 100. The controller 150 and the components thereof may be implemented as any suitable hardware/processor-executed software, processor-executed firmware, logic, and/or combinations thereof wherein the illustrated embodiment can be implemented largely in processor-executed software or firmware providing various control functions by which the controller 150 receives feedback and/or input signals and/or values (e.g., setpoint(s)) and provides the switching control signals 162, 172, 182 to operate the switching devices S1-S6 of the rectifier 120, the switches S7-S12 of the inverter, and the IGBT(s) Q1 of the precharging circuit 130. In addition, the controller 150 and the components 160, 170, 180, 190 thereof can be implemented in a single processor-based or one or more of these can be separately implemented in unitary or distributed fashion by two or more processor devices.

The exemplary controller 150 operates in one of three different modes, including a first mode for precharging the DC link capacitance C, a second mode for conducting regenerative current toward the AC source 10, and a third mode (motoring) for providing drive power to operate the AC motor 20. In certain embodiments, non-regenerative systems 100 are provided, in which the controller 150 operates only in the first mode for precharging the DC capacitance C and the third mode for providing output power, whether via the DC output terminals 105 (common bus supplied product 100) and/or providing AC output power for driving a motor load. In one or more of these operational modes, the controller 150 utilizes various feedback information including measured input line-line or line-neutral voltages $V_a$, $V_b$, $V_c$, sensed AC input line current values $I_a$, $I_b$, $I_c$ (obtained via current sensors disposed between the input filter circuit 110 and the rectifier 120 in one example), measured DC link voltage $V_{DC}$, and/or sensed AC output currents and voltages $I_u$, $I_v$, $I_w$ and $V_u$, $V_v$, $V_w$, etc. In addition, the controller 150 includes suitable interface circuitry in order to receive the various input and/or feedback signals and/or values, as well as suitable driver circuitry for generating switching control signals 162, 172, 182 of suitable electrical characteristics to actuate the associated switching devices S1-S6, Q1, S7-S12 operated according to the signals. As seen in FIG. 3, moreover, the motor drive 100 may include a user interface accessible from the exterior of the enclosure 102 by which a user may interact with the controller 150 in order to set operating values (e.g., setpoints, mode 190, etc.), view sensed operating conditions, etc.

The switching control signals 162, 172 for the switching devices S1-S12 of the rectifier 120 and/or inverter 140 may be provided by the controller 150 using any suitable switching scheme, which may involve one or more pulse width modulation (PWM) techniques including without limitation vector modulation (SVM), selective harmonic illumination (SHE), etc. In addition, the various components within the control system 150 may operate according to setpoint source other signals/values provided by another one of the control components. For instance, the inverter control 170 during normal motoring operation may provide a DC voltage setpoint signal or value to the rectifier controller 160, with the rectifier controller 160 regulating its output voltage according to the setpoint from the inverter controller 170. Moreover, operation of the rectifier 120, the precharging circuit 130, and the inverter 140 are coordinated by the controller 150 and the components 160, 180, and 170 thereof based on the currently selected operational mode 190.

Figure 4:
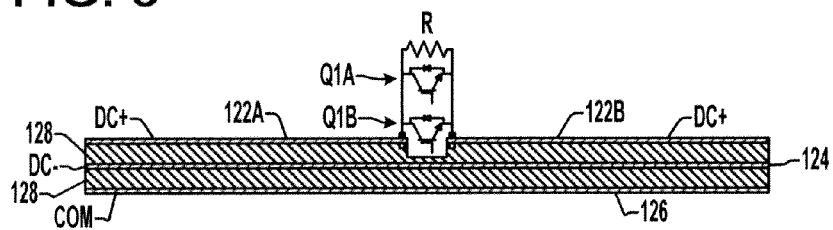
FIG. 4 is a partial side elevation view in section illustrating an exemplary laminated DC intermediate circuit implementation in the motor drives of FIGS. 1-3 in accordance with further aspects of the present disclosure.

Referring also to FIG. 4, the illustrated intermediate DC link circuit may be constructed in certain embodiments using a laminated plate structure including a pair of upper (+) conductive (e.g., aluminum) conductor portions 122A and 122B separated by the precharging circuit 130 and together constituting a first DC current path 122, as well as a second conductive (e.g., aluminum) plate 124 constituting a lower (−) DC current path 124, with the plates 122 and 124 being separated by an intervening electrical insulator layer 128. In certain embodiments, moreover, a third conductive (e.g., aluminum) plate 126 may be provided for a DC ground or system common spaced from the other plates using an insulative layer 128, where the various switching devices S1-S12 and Q1 may be electrically and mechanically connected to the corresponding plates 122, 124 using bolts and/or other fasteners for connection through associated holes in the plates 122, 124, 126 and insulation layers 128 to provide conductive connection where appropriate and spacing to avoid electrical connection where a given switching device terminal is passing through a conductive plate to which it is not to be electrically connected.

The inventors have appreciated that the conventional attempts to limit inrush current during initial charge up or precharging of the DC link capacitance C have various shortcomings as outlined above. In the illustrated regenerative motor drive 100, the precharging circuit 130 accordingly provides one or more IGBT precharge switching devices Q1 operative according to precharge control signal(s) 182 from the precharge control component 180 of the controller 150, where the IGBT(s) Q1 comprises a first power terminal coupled with the first conductor portion 122A of the intermediate DC circuit and a second power terminal coupled with the second conductor portion 122B. The precharging circuit 130 further includes a diode, which may in certain embodiments be incorporated into an integral package with the IGBT Q1. The precharging diode has a cathode coupled with the first conductor portion 122A and an anode coupled with the second conductor portion 122B in order to provide a current path for regenerative current in certain operational modes. In addition, the precharging circuit 130 includes a resistor or other current limiting device (or multiple current limiting devices) R coupled between the first and second conductor portions 122A and 122B so as to limit inrush current during precharging of the DC link capacitance C. Any suitable form of current limiting component can be used in the precharging circuit 130, including without limitation one or more resistors R, positive temperature coefficient (PTC) device(s), one or more MOSFETs operating in linear mode, etc. The DC link capacitance C, itself, may be constructed as a single capacitor or as a plurality of capacitors connected in any suitable series and/or parallel combinations to form a capacitance C coupled between the second conductor portion 122B of the first DC conductive path and the second DC conductive path 124.

The inventors have further appreciated that use of SCR type switches in such a precharging circuit can lead to unacceptably high series impedance during normal motoring operation, thereby inhibiting high efficiency operation of the motor drive 100. Accordingly, the precharging circuit 130 includes one or more IGBT type precharging switching devices Q1 coupled between the conductor portions 122A and 122B for activation during normal motoring operation (and optionally during regenerating operation), to provide a sufficiently low impedance conductive path through the upper (+) DC current path of the intermediate DC circuit to achieve good power efficiency. Furthermore, in certain embodiments, the laminated plate design for the intermediate DC circuit (e.g., FIG. 4) facilitates the use of IGBT type precharge switching devices Q1 by limiting the stray inductance of the intermediate DC circuit, to facilitate the use of the IGBT(s) Q1 with sufficient control stability allowing the rectifier controller 162 successfully regulate the DC voltage $V_{DC}$ in the link circuit.

Figure 5:
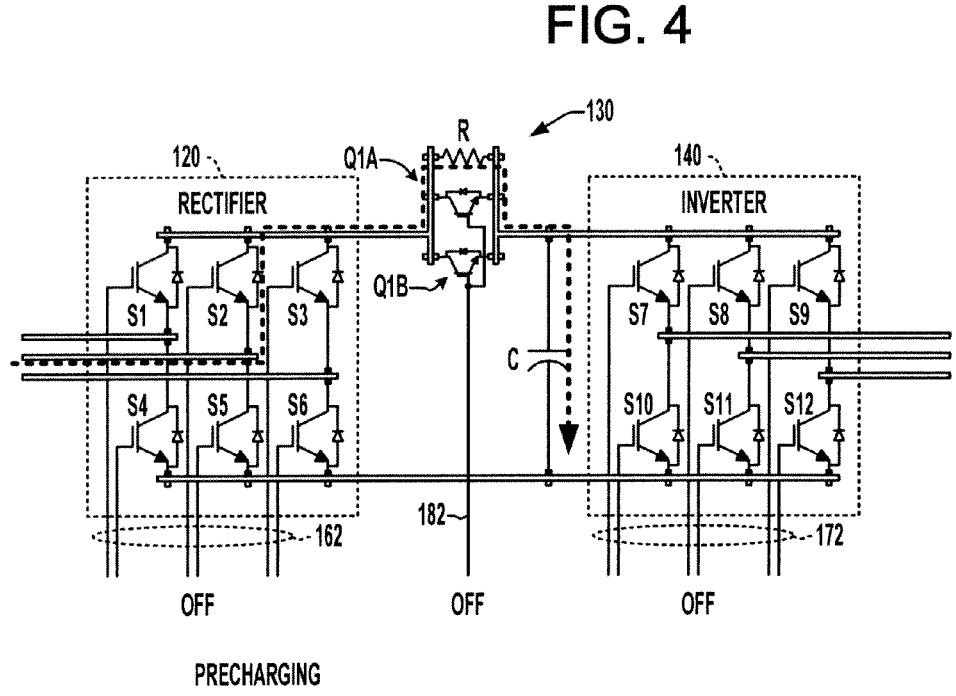
FIG. 5 is a simplified schematic diagram illustrating operation of the regenerative motor drives of FIGS. 1-4 in a precharging mode.
Figure 6:
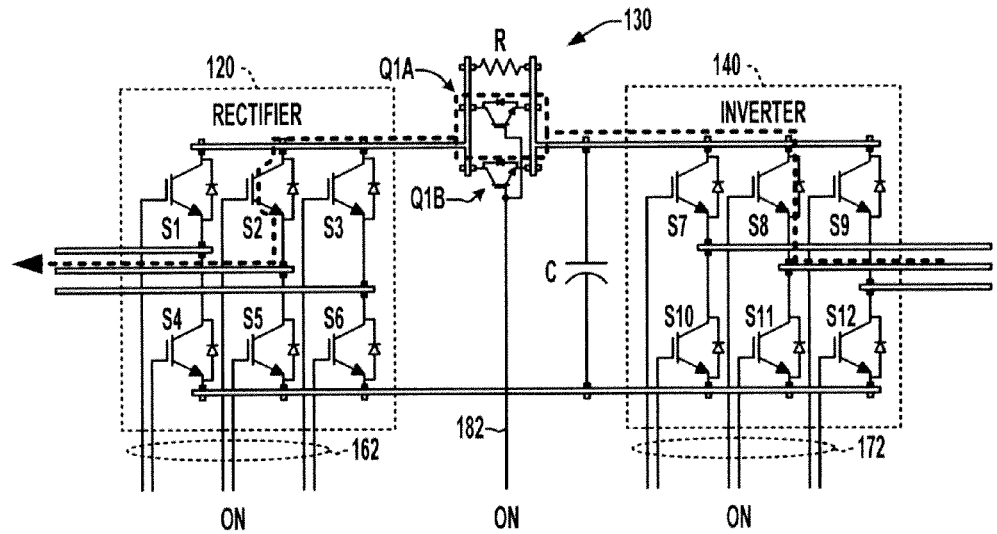
FIG. 6 is a simplified schematic diagram illustrating operation of the regenerative motor drives of FIGS. 1-5 in a regenerating mode.
Figure 7:
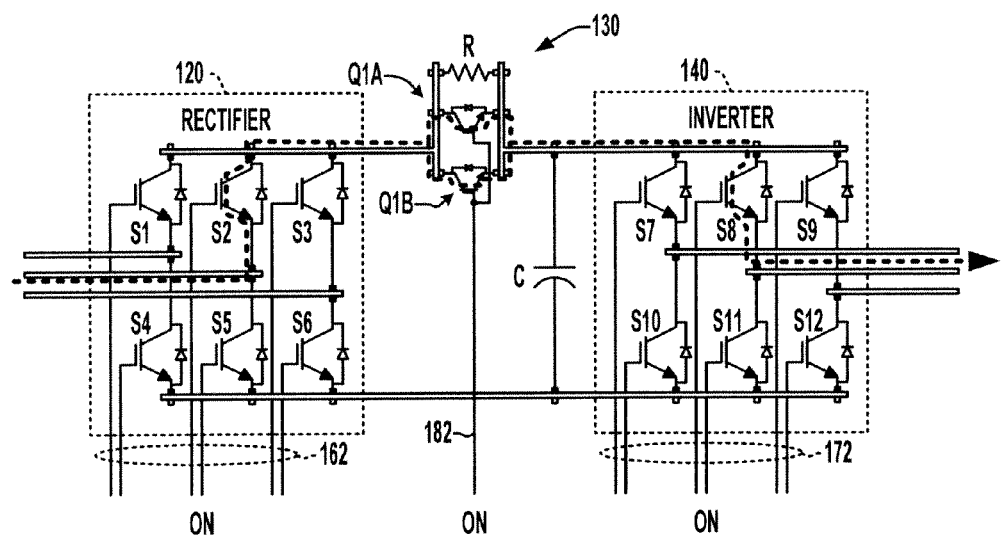
FIG. 7 is a simplified schematic diagram illustrating operation of the regenerative motor drives of FIGS. 1-6 in a motoring mode.

Referring also to FIGS. 5-7, the controller 150 operates the drive 100 in one of three operational modes by selective provision of the control signals 162, 172 and 182 to the rectifier 120, inverter 140, and precharging circuit 130, respectively. In particular, the controller 150 provides the switching control signals in a first (precharging) mode (e.g., at startup) to precharge the DC link capacitance C through the resistor R, as seen in FIG. 5. In particular, in this precharging mode, the control signals 162 are provided to effectively turn the switching devices S1-S6 of the rectifier 120 off, with precharging current flowing through the freewheeling diodes associated with the rectifier switches S1-S3 and into the DC link circuit 130 as seen in FIG. 5. In this mode, the precharge control component 180 of the controller 150 provides the precharge control signal 182 to maintain the one or more precharging switching devices Q1 in and off (e.g., high impedance) state, whereby the precharging current flows through the resistor R and into the positive terminal of the DC link capacitance C. In the precharging mode in certain embodiments, moreover, the inverter control component 170 provides the inverter switching control signals 172 in order to maintain the inverter switching devices S7-S12 in an off (e.g., high impedance) state, whereby the precharging current flows entirely through the DC link capacitor C, and returns through the second (−) DC current path 124 and back to the AC source 10 via the freewheeling diodes associated with the lower rectifier switches S4-S6.

A second (regenerating) operational mode is illustrated in FIG. 6, in which the controller 150 provides the rectifier switching control signals 162 so as to operate the rectifier 120 in a switching mode, whether switching at a generally fundamental input frequency (e.g., 50 or 60 Hz in certain examples) as exemplified in the embodiment of FIG. 1, or switching in a pulse width modulation fashion for active front end (AFE) operation at a switching frequency of one or more orders of magnitude above the AC input fundamental frequency, such as above 4 kHz in one example (FIG. 2). In the regenerating mode, the controller 150 provides the precharge control signal 182 in order to maintain the precharge switching device or devices Q1 in the on (e.g., low impedance) condition (or alternatively the precharge switching devices Q1 can be turned off). In either situation, regenerative current flows from the inverter 140 and/or from the DC link capacitor C through the precharging circuit diode(s) connected across the power terminals of the precharge IGBT(s) Q1, and from there the power is selectively switched via the rectifier switching devices S1-S6. Furthermore, in certain embodiments, the controller 150 provides the inverter switching control signals 172 as in normal motoring operation such that the inverter switching devices S7-S12 are pulse width modulated.

As seen in FIG. 7, in normal motoring mode, the precharge control signal 182 is provided by the controller 150 so as to turn on the precharge IGBT(s) Q1 (low impedance state), thereby providing a low impedance first (+) DC current path 122 including the first conductor portion 122A, the one or more activated IGBTs Q1, and the second conductor portion 122B. In this mode, the controller 150 operates the rectifier 120 via control signals 162 to perform rectification to convert input AC power received from the three-phase source 110 to provide a regulated DC bus voltage across the capacitance C, where the regulation may be done around a setpoint provided by the inverter controller 170 in certain embodiments. In addition, in this third (motoring) mode, the inverter switching control signals 172 are provided by the controller 150 in order to selectively switch the inverter switching devices S7-S12 according to any suitable pulse width modulation scheme to convert the DC bus voltage into three-phase AC electrical power to drive the motor load 20 according to any given setpoint value or values, such as according to a speed control and/or torque control scheme.

In this manner, the disclosed precharging apparatus and techniques provide for high-efficiency operation during motoring and/or regenerating modes for an integrated regenerative motor drive 100, and also facilitate reduction in the cost and/or weight of the drive 100 by use of one or more IGBTs Q1 in the precharging circuit 130 disposed in the intermediate DC circuit between the rectifier 120 and the inverter 140. In addition, as seen in FIGS. 1, 2 and 4-7, the precharging circuit 130 may include one or more IGBTs, where the illustrated embodiments show two such IGBTs Q1A and Q1B with integrated freewheeling diodes coupled in parallel with one another between the first and second conductor portions of the positive DC link current path 122. In certain embodiments, moreover, the precharging current limiting component (e.g., resistance R) can be implemented as a single current limiting component, or multiple current limiting components, connected in series or parallel or combinations thereof.

The above examples are merely illustrative of several possible embodiments of various aspects of the present disclosure, wherein equivalent alterations and/or modifications will occur to others skilled in the art upon reading and understanding this specification and the annexed drawings. In particular regard to the various functions performed by the above described components (assemblies, devices, systems, circuits, and the like), the terms (including a reference to a "means") used to describe such components are intended to correspond, unless otherwise indicated, to any component, such as hardware, processor-executed software, logic, or combinations thereof, which performs the specified function of the described component (i.e., that is functionally equivalent), even though not structurally equivalent to the disclosed structure which performs the function in the illustrated implementations of the disclosure. Moreover, the various control components may be implemented using computer-executable instructions for carrying out one or more of the above illustrated and described control operations, steps, tasks, where the instructions are included in a non-transitory computer-readable medium. In addition, although a particular feature of the disclosure may have been disclosed with respect to only one of several implementations, such feature may be combined with one or more other features of the other implementations as may be desired and advantageous for any given or particular application. Also, to the extent that the terms "including", "includes", "having", "has", "with", or variants thereof are used in the detailed description and/or in the claims, such terms are intended to be inclusive in a manner similar to the term "comprising".

The following is claimed:

1. An integrated AC regenerative motor drive, comprising:
   a switching rectifier having first and second DC output nodes;
   an intermediate DC circuit comprising at least one capacitance, a first DC current path including a first conductive plate connected to the first DC output node of the rectifier, and a separate second conductive plate spaced from the first conductive plate, and a second DC current path connected to the second DC output node of the rectifier, the at least one capacitance being connected between the second conductive plate and the second DC current path;
   an inverter comprising a first DC input node connected to the second conductive plate, a second DC input node coupled with the second DC current path;
   a precharging circuit comprising a current limiting component, a diode, and at least one insulated gate bipolar transistor (IGBT) precharge switching device connected between the first and second conductive plates of the intermediate DC circuit; and
   a controller operative in first, second, and third modes to provide switching control signals to the switching rectifier, the precharging circuit and the inverter to precharge the at least one capacitance of the intermediate DC circuit through the current limiting component of the precharging circuit in a first mode, to conduct regenerative current from the intermediate DC circuit through the diode of the precharging circuit in a second mode, and to conduct DC current through the IGBT of the precharging circuit and convert DC power from the intermediate DC circuit to provide AC electrical power to an AC motor load in a third mode.

2. The integrated AC regenerative motor drive of claim 1, comprising:
   a plurality of input terminals coupleable to an AC input source;
   a plurality of output terminals coupleable to an AC motor;
   the switching rectifier comprising a plurality of AC nodes coupled with the plurality of input terminals, and a plurality of rectifier switching devices individually coupled between one of the AC input nodes and one of the first and second DC output nodes, the rectifier switching devices individually operative to selectively couple a corresponding AC input node with a corresponding DC output node according to a corresponding rectifier switching control signal;

the at least one IGBT precharge switching device of the precharging circuit being operative according to a precharge control signal and including a first power terminal coupled with the first conductive plate and a second power terminal coupled with the second conductive plate;

the diode of the precharging circuit including a cathode coupled with the first conductive plate and an anode coupled with the second conductive plate;

the current limiting component of the precharging circuit being coupled between the first and second conductive plates;

the inverter comprising a plurality of AC output nodes coupled with the plurality of output terminals, and a plurality of inverter switching devices individually coupled between one of the DC current paths of the intermediate DC circuit and one of the AC output nodes, the inverter switching devices individually operative to selectively electrically couple the corresponding DC current path with the corresponding AC output node according to a corresponding inverter switching control signal; and the controller being operative to provide control signals to the switching rectifier, the inverter and the precharging circuit, the controller being operative in the first mode to provide the control signals to turn the switching devices of the switching rectifier, the precharging circuit and the inverter off to precharge the at least one capacitance through the switching rectifier and the current limiting component, the controller being operative in the second mode to provide the control signals to cause the rectifier to conduct regenerative current from the intermediate DC circuit to the input terminals through the diode of the precharging circuit, and the controller being operative in the third mode to provide the control signals to turn the precharge switching device on, to cause the rectifier to convert input power from the input terminals to provide DC power to the intermediate DC circuit, and to cause the inverter to selectively convert DC power from the intermediate DC circuit to provide AC electrical power to the output terminals.

3. The integrated AC regenerative motor drive of claim 2, wherein the precharging circuit comprises:

a plurality of diodes individually including a cathode coupled with the first conductive plate and an anode coupled with the second conductive plate; and a plurality of IGBT precharge switching devices operative according to the precharge control signal, the individual IGBT precharge switching devices including a first power terminal connected to the first conductive plate and a second power terminal connected to the second conductive plate.

4. The integrated AC regenerative motor drive of claim 3, wherein the individual IGBT precharge switching devices are integrated with a corresponding one of the plurality of diodes in the precharging circuit.

5. The integrated AC regenerative motor drive of claim 2, wherein the IGBT precharge switching device and the diode of the precharging circuit are integrated in a single package.

6. The integrated AC regenerative motor drive of claim 2, wherein the controller is operative to provide the rectifier switching control signals in the second mode at a frequency approximately equal to a fundamental frequency of the AC input source.

7. The integrated AC regenerative motor drive of claim 6, comprising an input filter including a plurality of input reactors, individual input reactors being coupled in series between a corresponding one of the input terminals and a corresponding one of the AC nodes of the switching rectifier.

8. The integrated AC regenerative motor drive of claim 2, comprising an input filter including a plurality of input reactors, individual input reactors being coupled in series between a corresponding one of the input terminals and a corresponding one of the AC nodes of the switching rectifier.

9. The integrated AC regenerative motor drive of claim 8, wherein the input filter comprises a plurality of L-C-L filter circuits with individual L-C-L filter circuits including first and second reactors coupled in series between the corresponding input terminals and the corresponding one of the AC nodes, and a filter capacitance coupled between a node joining the first and second reactors and a common terminal.

10. The integrated AC regenerative motor drive of claim 2, wherein the controller is operative to provide the rectifier switching control signals in the second mode using pulse width modulation (PWM) at a frequency at least one order of magnitude greater than a fundamental frequency of the AC input source.

11. The integrated AC regenerative motor drive of claim 10, comprising an input filter including a plurality of L-C-L filter circuits with individual L-C-L filter including first and second reactors coupled in series between the corresponding input terminals and the corresponding one of the AC nodes, and a filter capacitance coupled between a node joining the first and second reactors and a common terminal.

12. The integrated AC regenerative motor drive of claim 2, comprising a further conductive plate connected to the second DC output node of the rectifier, wherein the first and second conductive plates of the first DC current path are separated from the further conductive plate by an intervening electrical insulator layer in a laminated plate structure.

13. The integrated AC regenerative motor drive of claim 12, wherein the at least one IGBT precharge switching device is electrically and mechanically connected to the first and second conductive plates using fasteners for connection through associated holes in the first and second conductive plates.

14. The integrated AC regenerative motor drive of claim 2, wherein the at least one IGBT precharge switching device is electrically and mechanically connected to the first and second conductive plates using fasteners for connection through associated holes in the first and second conductive plates.

15. The integrated AC regenerative motor drive of claim 1, comprising a further conductive plate connected to the second DC output node of the rectifier, wherein the first and second conductive plates of the first DC current path are separated from the further conductive plate by an intervening electrical insulator layer in a laminated plate structure.

16. The integrated AC regenerative motor drive of claim 15, wherein the at least one IGBT precharge switching device is electrically and mechanically connected to the first and second conductive plates using fasteners for connection through associated holes in the first and second conductive plates.

17. The integrated AC regenerative motor drive of claim 1, wherein the at least one IGBT precharge switching device is electrically and mechanically connected to the first and second conductive plates using fasteners for connection through associated holes in the first and second conductive plates.

18. A power conversion system, comprising:
a switching rectifier having first and second DC output nodes;
a DC circuit comprising at least one capacitance, a first DC current path including a first conductive plate connected to the first DC output node of the rectifier, and a separate second conductive plate spaced from the first conductive plate, and a second DC current path connected to the second DC output node of the rectifier, the at least one capacitance being connected between the second conductive plate and the second DC current path;
a first DC output terminal connected to the second conductive plate;
a second DC output terminal connected to the second DC current path of the DC circuit;
a precharging circuit comprising a current limiting component, a diode, and at least one insulated gate bipolar transistor (IGBT) precharge switching device connected between the first and second conductive plates of the DC circuit; and
a controller operative in first, second, and third modes to provide switching control signals to the switching rectifier and the precharging circuit to precharge the at least one capacitance of the DC circuit through the current limiting component of the precharging circuit in a first mode, to conduct regenerative current from the DC circuit through a diode of the precharging circuit in a second mode, and to conduct DC current through the IGBT of the precharging circuit and to provide DC power from the DC circuit to the DC output terminals in a third mode.

19. The power conversion system of claim 18, comprising a further conductive plate connected to the second DC output node of the rectifier, wherein the first and second conductive plates of the first DC current path are separated from the further conductive plate by an intervening electrical insulator layer in a laminated plate structure.

20. The power conversion system of claim 19, wherein the at least one IGBT precharge switching device is electrically and mechanically connected to the first and second conductive plates using fasteners for connection through associated holes in the first and second conductive plates.

21. The power conversion system of claim 18, wherein the at least one IGBT precharge switching device is electrically and mechanically connected to the first and second conductive plates using fasteners for connection through associated holes in the first and second conductive plates.

* * * * *